United States Patent
Fontius et al.

(10) Patent No.: US 7,902,822 B2
(45) Date of Patent: Mar. 8, 2011

(54) METHOD FOR ADJUSTMENT OF A B1 FIELD OF A MAGNETIC RESONANCE APPARATUS

(75) Inventors: Joerg Ulrich Fontius, Neunkirchen A. Brand (DE); Franz Schmitt, Erlangen (DE); Karsten Wicklow, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 373 days.

(21) Appl. No.: 12/051,127

(22) Filed: Mar. 19, 2008

(65) Prior Publication Data
US 2008/0231270 A1 Sep. 25, 2008

(30) Foreign Application Priority Data
Mar. 19, 2007 (DE) .................. 10 2007 013 060

(51) Int. Cl.
*G01V 3/00* (2006.01)
(52) U.S. Cl. ................... 324/307; 324/309
(58) Field of Classification Search .......... 324/300–322; 600/410–435
See application file for complete search history.

(56) References Cited

U.S. PATENT DOCUMENTS

| | | | |
|---|---|---|---|
| 6,522,910 B1 * | 2/2003 | Gregory ................. 600/427 |
| 6,841,999 B2 | 1/2005 | Arneth et al. | |
| 7,223,264 B2 * | 5/2007 | Daniel et al. .............. 606/41 |
| 7,511,492 B2 * | 3/2009 | Sodickson et al. ......... 324/309 |
| 7,529,398 B2 * | 5/2009 | Zwirn et al. ............... 382/131 |
| 7,573,266 B2 * | 8/2009 | Feiweier et al. ........... 324/307 |
| 7,660,452 B2 * | 2/2010 | Zwirn et al. ............... 382/131 |
| 7,664,303 B2 * | 2/2010 | Zwirn et al. ............... 382/131 |

OTHER PUBLICATIONS

"Calculation of all SAR and $B_1$-Field Within Human Head Excited by MRI Birdcage Coils," Chen et al, IEEE Antennas and Propagation Society Int. Symposium Digest, vol. 2 (1997).

* cited by examiner

*Primary Examiner* — Melissa J Koval
*Assistant Examiner* — Dixomara Vargas
(74) *Attorney, Agent, or Firm* — Schiff Hardin LLP

(57) ABSTRACT

In a method for adjustment of a B1 field in a magnetic resonance apparatus, the position of the measurement subject relative to a coordinate system is determined from a plurality of measurement subjects with a morphological magnetic resonance measurement. Respective tissue types of the measurement subject are determined using three-dimensional measurement subject data and a segmentation of the measurement subject into regions is effected using the tissue types having known dielectric properties. The segmentation and the association for all positions of the measurement subject are recorded for all subjects in respective entries of a database. A radio-frequency simulation for transmission coils is implemented with the entries of the database wherein electrical field distributions and/or B1 field distributions related to spatial elements are determined and are entered as results into the database, that is then used further magnetic resonance examinations.

13 Claims, 1 Drawing Sheet

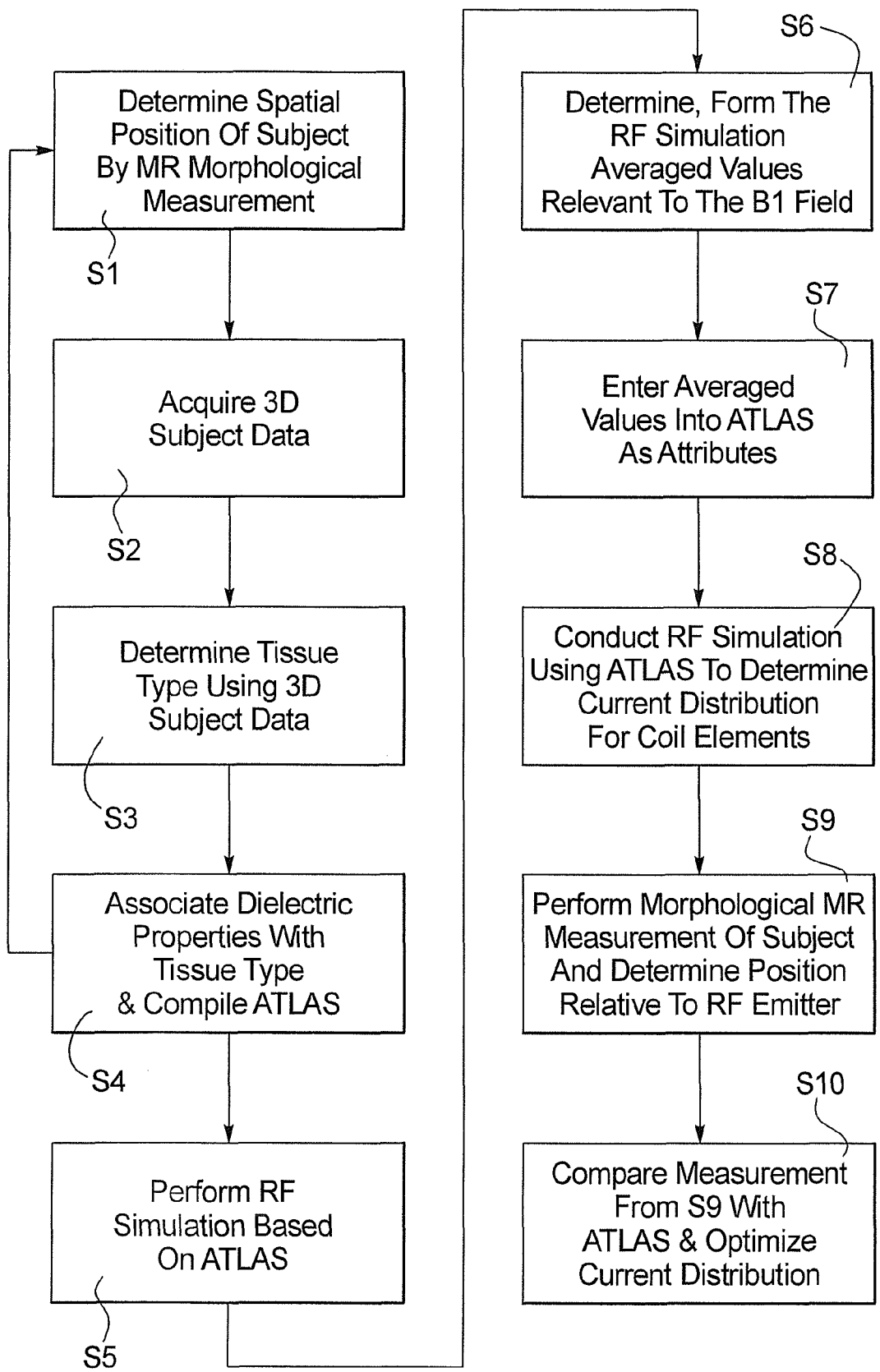

METHOD FOR ADJUSTMENT OF A B1 FIELD OF A MAGNETIC RESONANCE APPARATUS

BACKGROUND OF THE INVENTION

1. Field of the Invention

The present invention concerns a method for adjustment of a B1 field in a magnetic resonance apparatus, and a method for generation of a database for this purpose.

2. Description of the Prior Art

In the operation of a magnetic resonance apparatus, the examination subject is exposed to radio-frequency (RF) energy, in the form of RF pulses. The RF energy causes the nuclear spins in the examination subject that have been previously aligned by a strong, static magnetic field, to be deflected from the aligned (equilibrium) orientation. The precessing nuclear spins, as they return to their equilibrium position, cause an RF signal to be emitted from the subject, which is detected and analyzed to generate an image of the subject. The electromagnetic field that is produced by the emitted RF energy is referred to as the B1 field.

Problems occur in the adjustment of the homogeneity of the B1 field due to the use of increasingly strong magnetic field strengths in magnetic resonance tomography systems and the increasing excitation frequencies associated with the use of such strong fields. Inhomogeneous image brightnesses and image contrasts are the result. These are dependent on the structure of the measurement subject to be examined, for example on the anatomy of a patient to be examined.

Inhomogeneous image brightnesses dependent on the patient cannot be reduced or avoided by a uniformly designed radio-frequency coil.

It is possible to use a transmission antenna arrangement (known as a "Tx array") in order to adjust the homogeneity of the B1 field in a beneficial manner. This ensues by an optimized current distribution to sub-systems of the transmission antenna of the Tx array. Electrical fields that can elevate the temperature of the tissue of the subject are also produced in the measurement subject (for example in the human body) by different current distributions among the transmission antennas. For example, an antenna of the type known as a birdcage antenna, that is formed by a number of coil elements, is known for use as a transmission antenna arrangement (an RF coil).

A measure of the heating due to RF absorption is the Specific Absorption Rate, (SAR). Predetermined SAR limits (that are predetermined, for example, in IEC standards) must be complied with.

In magnetic resonance apparatuses with magnetic field strengths of greater than or equal to three Tesla, a differentiation exists between a local SAR value ($SAR_{local}$) that is limited to a limited volume, and a global SAR value ($SAR_{global}$) averaged over an entire volume. Ideally the two SAR values $SAR_{local}$ and $SAR_{global}$ should approximately correspond, but in reality this is not the case at the aforementioned higher magnetic field strengths.

For transmission pulses that are used to examine the patient, the power is measured, evaluated with the aid of software, and used to estimate the global SAR value and the local SAR value. The SAR values (and thus also their estimates) are dependent on the employed transmission antenna or transmission antenna arrangement.

A direct determination of the electrical field is not possible, but it can be analyzed with the use of complicated simulation programs and simulation calculations.

Software programs (for example from the company "Remcon" (www.remcon.com)) can be used for simulation. This company in particular provides software for electromagnet analysis, for microwave simulations, for antenna simulations and for determination of radio wave propagation for biomedical applications.

Such programs employ elaborately generated human models, for example the model of a man designated as "HUGO" or the model of a woman designated as "IRENE". Both models provide their respective tissue types in a three-dimensional data set.

Using such models, it is possible to determine the influence of a specific person or his or her tissue on an employed transmission antenna and to determine tissue-dependent variations of the B1 field and, from those, variations of the electrical field. From the modeled current distribution to the transmission antenna elements, it is possible to determine and to compensate an assumed (calculated variation of the B1 magnetic field and of the electrical field.

Since "HUGO" and "IRENE" describe only a specific person as a model, no better than a relatively imprecise compensation is achievable.

SUMMARY OF THE INVENTION

An object of the present invention is to provide tools with which the homogeneity of the B1 field can be adjusted in a beneficial manner for an examination with a magnetic resonance apparatus.

This object is achieved by a method in accordance with the invention for adjustment of a B1 field in a magnetic resonance apparatus wherein the position of the examination subject relative to a coordinate system is determined from a number of measurement subjects by a morphological magnetic resonance measurement (data acquisition). Three-dimensionally associable subject data are determined from each examination subject. Respective tissue types of the examination subject are determined using the three-dimensional subject data and a segmentation of the examination subject into regions is done using the tissue types. Known dielectric properties are respectively associated with the tissue types.

The segmentation and the association for all positions of the examination subject are recorded in respective entries of a database, such that the database contains all entries of the examination subjects. A radio-frequency simulation for all coil elements of a transmission antenna to be characterized or to be established is implemented with the entries of the database, with which radio-frequency simulation electrical field distributions and/or B1 field distributions related to spatial elements are determined as a simulation result, and are entered as results into the database.

For further magnetic resonance examinations the entries of the database are used to determine an optimized current distribution for elements of this transmission antenna via which the B1 field is ultimately adjusted.

In the present invention, a type of Atlas is generated as a statistical database, or as a reference work. For further examinations to be conducted, the database is used for optimized adjustment, for example of a homogeneous B1 field or for adherence to a desired SAR value or for adjustment of an E-field or to determine a power distribution or for optimization of other conditions.

An improved estimation of a SAR value to be expected, as well as the electrical field and the power distribution in the human body, advantageously enabled. The ratio of a local SAR value to a global SAR value can be further optimized in order to prevent an excessive increase of the local SAR value.

BRIEF DESCRIPTION OF THE DRAWINGS

The single FIGURE is a flow chart of an embodiment of a method for adjustment of a B1 field in a magnetic resonance apparatus, in accordance with the present invention.

DESCRIPTION OF THE PREFERRED EMBODIMENTS

The invention is explained in an exemplary and non-limiting manner using the head of a subject to be examined as the examination subject.

In a first step S1 a spatial position is determined by conducting a morphological magnetic resonance measurement of a head.

The relative position of the head describes not only its alignment relative to reference axes but also the distance therefrom to a transmission antenna (an RF coil) or to the coil elements thereof. The transmission antenna is used in the morphological magnetic resonance measurement.

The position of the head is established and registered in relation to a coordinate system predetermined by the atlas.

In a second step S2, morphological samples ("scans") of the head are conducted in order to acquire three-dimensional associable measurement subject data, namely head data.

Sequences designated as "MPRAGE" sequences ("Magnetization Prepared Rapid Gradient Echo Imaging", MPRAGE) are preferably used that are known from imaging methods by J. P. Mugler and Brookman for brain examinations.

These MPRAGE sequences enable an excellent T1 weighting at a high resolution in spatial elements of smaller than 1 mm³ (known as voxels).

As an alternative to the MPRAGE sequences, it is possible to use sequences known as "3D gradient echo sequences". In general all sequences are suitable that can be used for clear demarcation of various tissue types.

In a third step S3, respective tissue types of the head are determined using the three-dimensional measurement subject data and a segmentation of the head into regions is done using the tissue types.

For example, the head is sub-divided into regions with scalp, skullcap, grey and white brain matter, vertebral body, enclosed air and fluid. Moreover, eyes and auditory organs can be included.

Known dielectric properties are respectively associated with the tissue types or the respective voxels (x, y, z) therein in a fourth step S4.

For example, values or value ranges for a permeability constant $\in$, a loss factor tan $\delta$, or a conductivity a can be associated.

The segmented measurement subjects are positioned relative to the RF coil with the aid of translation and rotation operations. Respective entries therewith occur for every alignment, for every distance and for different positions relative to the coil.

These entries form the basis for a statistical database that is subsequently designated as an ATLAS.

The steps S1 through S4 are repeated for a sufficiently high number of further heads in order to obtain a large number of statistical entries for the ATLAS.

A radio-frequency simulation (designated as an RF simulation) for the entries of the ATLAS data set ensues in a fifth step S5.

In the simulation it is assumed that coil elements of the transmission antenna (or, respectively, RF coil, RF transmission coil) employed for simulation exhibit a normal current distribution or are supplied with a uniform current. For example, a CP excitation is assumed given a birdcage resonator as the transmission antenna.

The RF simulation delivers simulation results $RF_i^j$ for every measurement subject and for every single coil element, wherein i designates a measurement subject number (here the number of a head with corresponding position) and j designates a coil element.

The following values with regard to spatial elements or voxels are determined as simulation results for every position of the head and for every distance of the head from the respective coil element:

the respective field $E_i^j$ (as a vector),
the B1 field $B1_i^j$ (as a vector),
the SAR value $SAR_i$ and
an expected power loss $Pv_i$ (x, y, z).

The SAR value and the power loss Pv can possibly also be determined retroactively using the electrical field E and the B1 field.

An averaging of the simulation results for the number N of the measurement subjects is implemented in a sixth step S6, for example using the formula:

$$\frac{1}{N}\sum_{i=}^{N} x_i$$

Averaged (abbreviated with "ave") values for SAR(ave), E(ave), B1(ave) and Pv(ave) thereby result for every voxel dependent on the relative position and the distance to a coil element.

Average values can be calculated from various subsets of the atlas. For example, the average value can be formed across all heads with different orientations and positions. Alternatively, the average value can be formed within the subset regarding a specific position. Alternatively, the average value of the electrical field can be formed for the individual coil elements of a multi-transmitter transmission coil (for example a birdcage antenna structure).

The averaged values SAR(ave), E(ave), B1(ave) and Pv(ave) are, for example, related a respective oil element j via specification of a translation $\Delta r$ (here as a vector) and the rotation angles $\Delta \phi$ and $\Delta \theta$ and therewith describe the position of the head relative to the coil element j.

In a seventh step S7 the averaged values SAR(ave), E(ave), B1(ave), Pv(ave) are entered into the ATLAS as what are known as attributes.

In an embodiment, not only are the average values SAR (ave), E(ave), B1(ave), Pv(ave) entered but their respective variances and standard deviations are determined and likewise entered as additional attributes.

Correlation coefficients and statistically relevant derived values are likewise determined and entered as additional attributes.

Depending on the intended use of the ATLAS data set, certain required statistical calculations can thus be executed and be stored in the ATLAS as attributes.

In an embodiment, the results determined by simulation for the electrical field $E_i^j$, for the magnetic B1 field $B1_i^j$, for the SAR value $SAR_i$ and for the power loss $Pv_i^j$ as a function of the location (x, y, z) are entered into the ATLAS data set without averaging as additional attributes in the form of a look-up table.

In a further embodiment, a representative head (the voxels thereof again being associable with respective simulation results) is formed from the measurement subject data of all heads. A spatial mapping of all individual heads to one another (that is generally designated as a registration) with regard to a common coordinate system ensues for this purpose.

Desired RF simulations can now be implemented with the entries of the ATLAS database.

For example, a current distribution of the coil elements for an optimized B1 field while adhering to a predetermined SAR value can be determined by simulation (step S8).

Alternatively, an optimization with regard to a tolerable SAR value ensues in order to obtain an improved image depiction of examination results using maximum allowable transmission signal powers.

Alternatively, an optimization is implemented only with regard to a sub-region designated as a region of interest, (ROI).

Arbitrary optimization goals can be implemented with respective predeterminable boundary conditions.

The optimization results are likewise stored as results in the ATLAS data set.

The ATLAS database is preferably centrally stored, such that authorized users can expand these in steps with further examination results.

The respective simulations are regularly implemented as an update of the database and the statistical ATLAS is steadily expanded. Its statistical quality is therewith constantly adapted and improved.

The use of the statistical atlas data set is subsequently described by way of example for an examination of the head of a patient to be conducted.

A start value for adjustment of a desired B1 field based on the representative average head can already be determined in advance with the simulation results that, for example, are associated with the representative head.

For example, a computational optimization of the B1 field under consideration of the SAR value to be expected could be implemented, wherein the optimization yields a current distribution for the individual antenna elements. Due to the statistical approach such a determined current distribution is better suited than a current distribution based on the model of "HUGO" or "IRENE".

Alternatively, an examination of a head of a patient is to ensue. The head is then examined or scanned with a morphological magnetic resonance measurement (step S9) and its position relative to the RF emitter (i.e. relative to the RF coil or coil elements) is thereby determined.

Values for the translation $\Delta r$ (as a vector) and rotation $\Delta \phi$ and $\Delta \theta$ result as part of the scan.

A comparison with the ATLAS data set is implemented with the morphological measurement subject data of the head and an individual entry of a head comparable with the head of the patient is selected. Here the comparison thus ensues using the ATLAS data set embodied as a look-up table.

An optimized current distribution in the coil elements of the RF coil can in turn be selected from this entry, which due to the correlation also ensures a homogeneous B1 field in the head to be examined while adhering to a predetermined SAR value (step S10).

Alternatively, using the relative position of the head, a matching entry is selected from the ATLAS database, a current distribution optimized with the averaged values is determined and used for subsequent examination.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for adjusting a B1 field in a magnetic resonance apparatus, comprising the steps of:
    for each of a plurality of measurement subjects, operating a magnetic resonance data acquisition unit to acquire morphological magnetic resonance measurement data from a subject and, from the morphological magnetic resonance measurement data for that subject, automatically identifying in a computerized processor, a position of the subject relative to a coordinate system in which a position of an RF emitter of the magnetic resonance apparatus is identifiable;
    for each subject, operating a magnetic resonance data acquisition unit to acquire three-dimensional subject data;
    from the three-dimensional subject data, automatically determining in a computerized processor, respective tissue types in the subject, and segmenting the three-dimensional subject data representing the subject into respective regions dependent on the respective tissue types;
    in a computerized processor, for each tissue type for each subject, associating known dielectric properties therewith;
    compiling an electronic data base in a memory for all of said subjects by, for each position of each subject, making entries for the respective segmentation regions and the dielectric properties associated therewith;
    using said data base, operating a magnetic resonance data acquisition unit to acquire an RF simulation for said RF emitter in which at least one of a resulting electrical field spatial distribution and a B1 field spatial distribution is automatically generated as a simulation result, and entering the simulation result into the data base; and
    for a subsequent resonance examination of a subject using said RF emitter in said magnetic resonance apparatus, obtaining magnetic resonance data from that subject by operating a magnetic resonance data acquisition unit using the data base containing said simulation result to automatically determine an electrical field spatial distribution, an SAR distribution, and an optimized current distribution for said RF emitter, that adjust the B1 field for said subsequent examination.

2. A method as claimed in claim 1 comprising designating the position of the subject relative to said coordinate system by alignment with respect to reference axes and identifying the position of the RF emitter by a distance of the subject from at least one emitting element of the RF emitter.

3. A method as claimed in claim 1 wherein said RF emitter comprises a plurality of emitter elements, and in said RF simulation, characterizing said emitter elements with a uniform current distribution.

4. A method as claimed in claim 1 wherein said radiofrequency emitter is comprised of a plurality of emitter elements and, from said RF simulation for each subject, obtaining simulation results comprising an electrical field distribution, a B1 field distribution, an SAR value, and a power loss, for the respective emitter elements.

5. A method as claimed in claim 4 comprising entering said simulation results into said data base in a look-up table format.

6. A method as claimed in claim 4 comprising averaging said simulation results for each subject to obtain averaged values of said simulation results; and organizing said averaged values to produce at least one organized compilation selected from the group consisting of a set of averaged values for all subjects at all positions relative to the RF emitter, respective subsets for respective subjects in selected positions relative to said RF emitter; and subsets relative to respective emitter elements among said plurality of emitter elements.

7. A method as claimed in claim 6 comprising also determining a standard deviation of said simulation results, correlation coefficients of said simulation results and statistical parameters of said simulation results, and entering said variances, said standard deviations and said statistical parameters into said data base.

8. A method as claimed in claim 4 comprising generating a representative subject from all of the data in said data base.

9. A method as claimed in claim 1 wherein said RF emitter is comprised of a plurality of emitter elements and entering the optimized current distribution for the emitter elements for each radio-frequency simulation into said data base.

10. A method as claimed in claim 9 comprising, from said database, determining at least one of a current distribution that produces a homogenous B1 field with a predetermined SAR value, and a current distribution for a predetermined SAR value.

11. A method as claimed in claim 9 comprising:
acquiring subject data for a further subject and the position of the further subject relative to said RF emitter with a further morphological magnetic resonance measurement;
comparing the subject data for the further subject with said data base to identify entries in the database for a subject in the database comparable to the further subject; and
extracting the entries from the database resulting from the comparison and using the extracted entries to optimize the B1 field in a magnetic resonance data acquisition of the further subject.

12. A method as claimed in claim 1 comprising conducting said morphological magnetic resonance measurement using an imaging sequence selected from the group consisting of MPRAGE sequences and 3D gradient echo sequences, and sequences allowing demarcation of tissue types.

13. A method as claimed in claim 1 comprising using, as said dielectric properties, dielectric properties selected form the group consisting of permeability constants, loss factors, and conductivity.

* * * * *